United States Patent
Ito

(10) Patent No.: US 6,949,731 B2
(45) Date of Patent: Sep. 27, 2005

(54) LIGHT-RECEIVING MODULE HAVING A LIGHT-RECEIVING DEVICE ON A DIE-CAPACITOR

(75) Inventor: Makoto Ito, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 47 days.

(21) Appl. No.: 10/783,097

(22) Filed: Feb. 23, 2004

(65) Prior Publication Data

US 2004/0227062 A1 Nov. 18, 2004

(30) Foreign Application Priority Data

Feb. 26, 2003 (JP) ........................................ 2003-049994

(51) Int. Cl.$^7$ ............................................... H01J 40/14
(52) U.S. Cl. .................................. 250/214 R; 327/514
(58) Field of Search ............................ 250/214 R, 239; 327/514; 361/301.1, 328, 760, 764–765

(56) References Cited

U.S. PATENT DOCUMENTS

| | | | |
|---|---|---|---|
| 5,652,425 A | | 7/1997 | Sawada et al. |
| 6,847,665 B2 | * | 1/2005 | Yamada et al. .......... 372/38.08 |
| 6,900,512 B2 | * | 5/2005 | Kohmoto et al. ........... 257/435 |
| 2003/0183834 A1 | * | 10/2003 | Kohmoto et al. ............. 257/98 |
| 2004/0008953 A1 | * | 1/2004 | Ito et al. ....................... 385/92 |

FOREIGN PATENT DOCUMENTS

JP 6-302631 10/1994

OTHER PUBLICATIONS

U.S. Appl. No. 10/373,186, filed Feb. 20, 2003, Kohmoto et al.
U.S. Appl. No. 10/397,839, filed Mar. 27, 2002, Kohmoto et al.

* cited by examiner

Primary Examiner—David Porta
Assistant Examiner—Patrick J. Lee
(74) Attorney, Agent, or Firm—McDermott Will & Emery LLP

(57) ABSTRACT

The present invention provides a light-receiving module that realized a reliable wire bonding from a light-receiving device to a die-capacitor on which the light-receiving device is mounted with adhesive. The light-receiving module of the present invention includes a stem and a die-capacitor disposed on the set. The upper electrode of the die-capacitor has a mounting area where the light-receiving device is mounted, a bonding area to which the bonding-wire is to be bonded, and a structure for interrupting the adhesive from spreading from the mounting area to the bonding area. Since the adhesive for die-bonding the light-receiving device in the mounting area does not spread to the bonding area, the wire-bonding to the bonding area can be reliably performed.

10 Claims, 3 Drawing Sheets

LIGHT-RECEIVING MODULE HAVING A LIGHT-RECEIVING DEVICE ON A DIE-CAPACITOR

CROSS-REFERENCE TO RELATED APPLICATIONS

This application contains subject matter that is related to the subject matter of the following applications, each of which is assigned to the same assignee as this application Each of the below-listed applications is hereby incorporated herein by reference in its entirety: "A light-receiving Module" by Kohmoto et al., Ser. No. 10/373,186; and "A light-receiving Module" by Kohmoto et al., Ser. No. 10/397,839.

BACKGROUND OF THE INVENTION

1. Field of the Invention

This invention relates to a light-receiving module, in which a light-receiving device is mounted on a die-capacitor, and a method for manufacturing the same.

2. Related Prior Art

A conventional light-receiving module has been disclosed in, for example, U.S. Pat. No. 5,652,425. The optical module in the patent comprises a light-receiving device, a capacitor having a capacitance equivalent to the light-receiving device and connected thereto, and a pre-amplifier for amplifying the output signal of the light-receiving device. These components are enclosed in a package with the TO standard.

In the light-receiving module, the light-receiving device is mounted on the die-capacitor and electrically connected to the upper electrode of the die-capacitor to reduce leak current from the light-receiving device to the package. In such arrangement, the light-receiving device is mounted on and fixed to the die-capacitor with an adhesive. However, when the light-receiving device is mounted after applying the adhesive on the upper electrode, the adhesive may spread to a region where the bonding-wire is to be bonded, which causes an unreliable bonding between the bonding-wire and the upper electrode of the die-capacitor.

One object of the present invention is to provide a light-receiving module that has a light-receiving device on a die-capacitor and the wire bonding between the light-receiving device and the electrode of the die-capacitor is reliably preformed.

SUMMARY OF THE INVENTION

According to the present invention, a light-receiving module comprises a stem, a first die-capacitor, a light-receiving device and a bonding-wire. The first die-capacitor is mounted on the stem and has an upper electrode including a mounting area and a bonding area. The light-receiving device is mounted on and fixed to the mounting area of the upper electrode with a fixing material. The bonding-wire electrically connects the light-receiving device to the bonding area of the upper electrode. In the present invention, the upper electrode of the die-capacitor has a structure for interrupting the fixing material from spreading from the mounting area to the bonding area.

The interrupting structure may be a slit and a groove both formed in the upper electrode of the die-capacitor. The fixing material may be an adhesive and a conductive resin.

Since the upper electrode of the die-capacitor has a interrupting structure for interrupting the fixing material from spreading from the mounting area to the bonding area, the wire bonding to the upper electrode can be enhanced in its connecting reliability.

DETAILED DESCRIPTION OF PREFERRED EMBODIMENTS

Next, preferred embodiments of a light-receiving module and a manufacturing method of the light-receiving module will be described as referring to accompany drawings.

Figure 1:
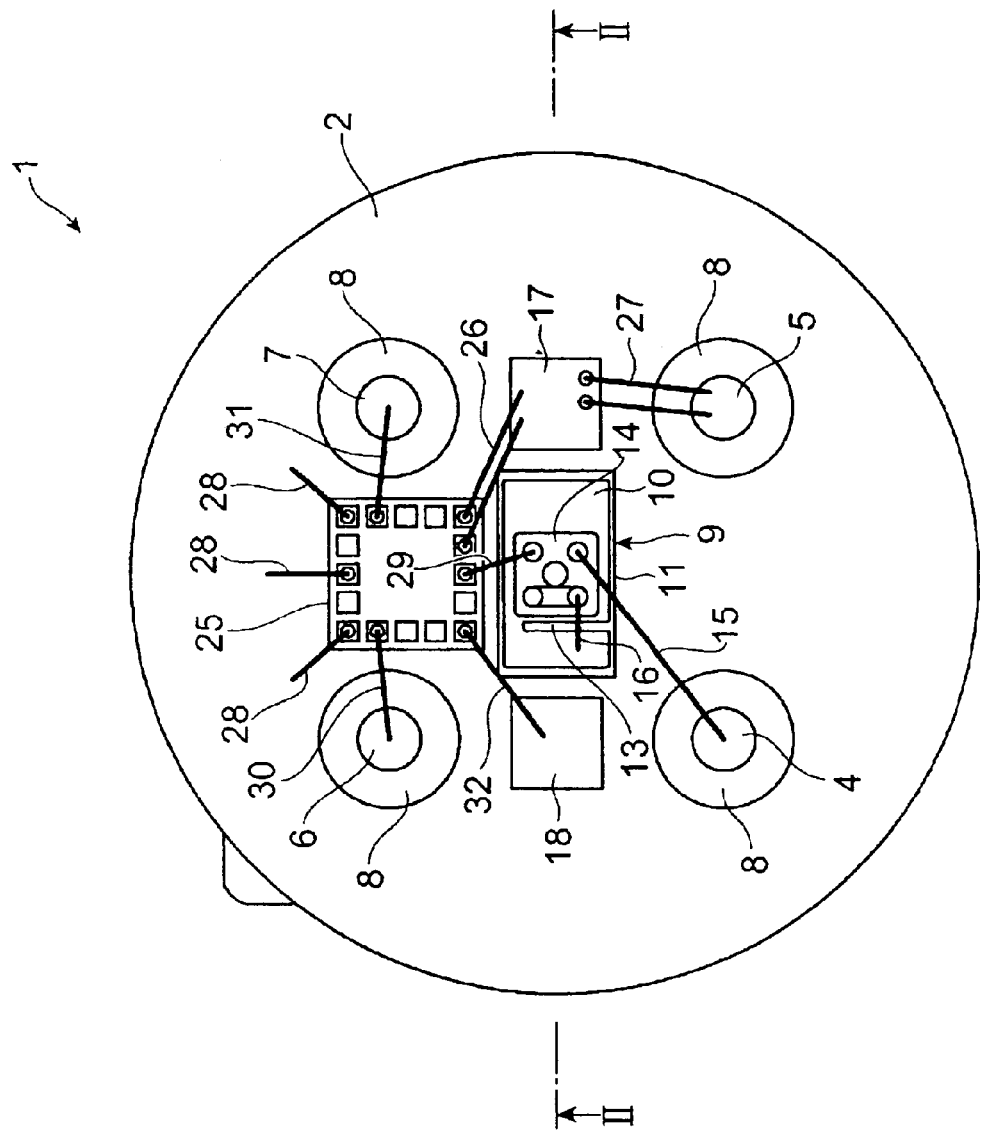
FIG. 1 is a plan view showing the light-receiving module according to the present invention.
Figure 2:
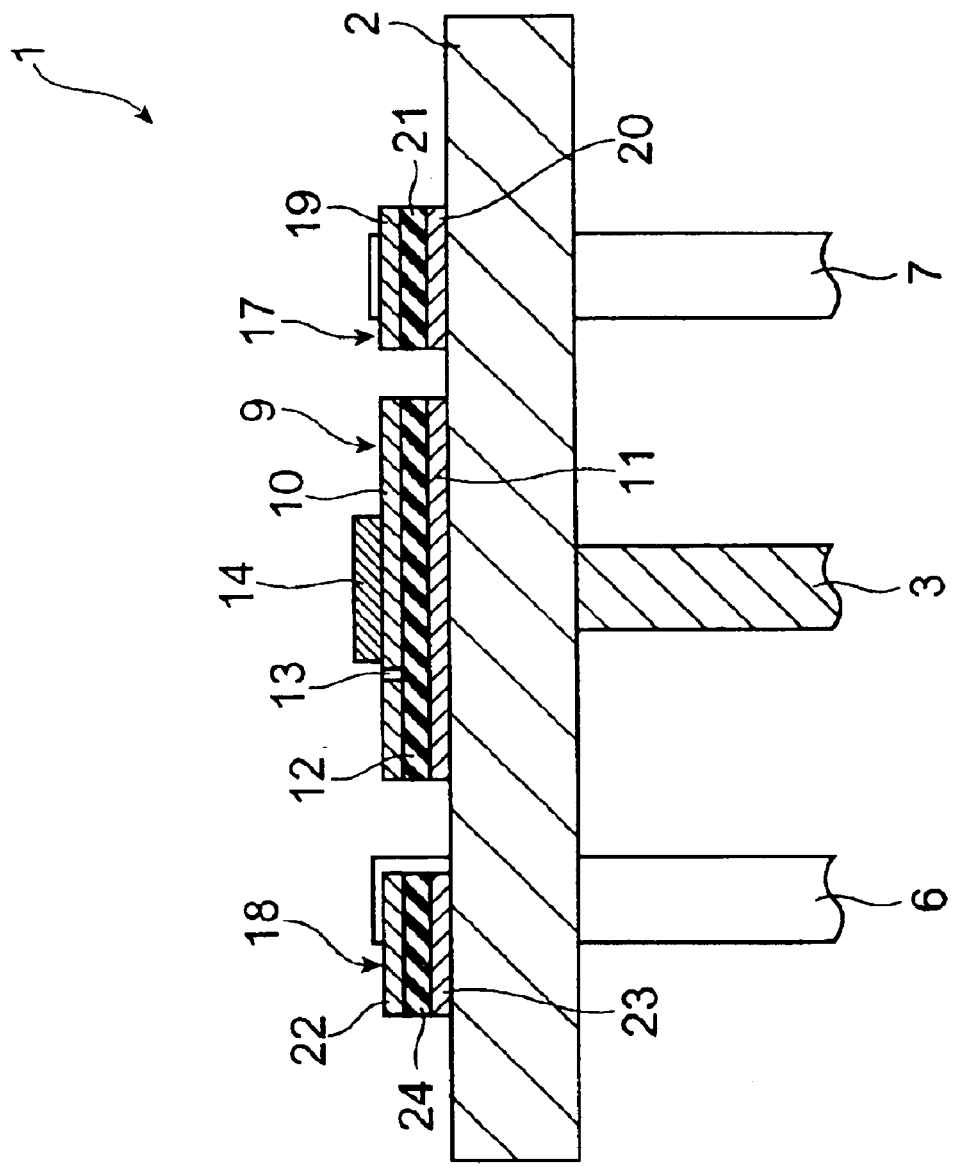
FIG. 2 is a cross sectional view of the light-receiving module along the line II—II in FIG. 1; and From FIG. 3A to FIG. 3C are showing the process for manufacturing the light-receiving module of the present invention.

FIG. 1 is a plan view of a light-receiving module according to the present invention, FIG. 2 is a vertical cross sectional view of the light-receiving module. The light-receiving module 1 includes a stem 2 with a substantially disk shape, which has a plurality of lead terminals 3 to 7. The lead terminal 3 is for grounding the stem 2, which is attached to a center of the stem 2 in a secondary surface thereof. The lead terminals 4 and 5 are for supplying bias voltage within in the module 1, and the lead terminals 6 and 7 are for outputting signals therefrom. These lead terminals from 4 to 7 pass through the stem 2 and are fixed to the stem 2 by seal glass 8. The stem 2 also has a cover, which is not shown in FIG. 2 and FIG. 3, with a lens provided in a center thereof.

On the stem 2, a die-capacitor-9 is provided. The die-capacitor 9 has an upper electrode 11, a lower electrode 10 and a dielectric material 12 therebetween, which constitutes a parallel-plate capacitor. The lower electrode 11 faces the stem 2 and electrically contact to the stem 2, accordingly the lower electrode 11 is grounded. The upper electrode 10 is made of layered metal, such as tantalum nitride/titanium/palladium/gold from the dielectric material in this order. On the other hand, the lower electrode 11 is made of another layered metal, such as titanium/palladium/gold. The dielectric material is, for example, aluminum oxide, silica glass, or titanium dioxide.

A longer side of the die-capacitor 9 is about 1.1 mm, while a shorter side thereof is about 0.6 mm. The thickness of the die-capacitor 9 is typically from 130 µm to 180 µm.

A slit 13 is provided in the upper electrode 10 of the die-capacitor for prohibiting adhesive from spilling. The slit 13 extends from one side to a point close to a corresponding side of the upper electrode 10. Since the upper electrode is not electrically and physically divided into two portions, capacitance necessary for the circuit design may be obtained.

A light-receiving device 14 is die-bonded on the upper electrode 14. The light-receiving device 14 is a semiconductor device that converts a light signal entered from an optical fiber disposed over the module 1, which is not shown in FIG. 1 and FIG. 2, into an corresponding electrical signal. The light-receiving device includes a photodiode and a resistor monolithically integrated in the device 14. By placing the light-receiving device 14 on the upper electrode 10 of the die-capacitor 9, a leak current from electrodes of the light-receiving device 14 to the stem 2 may be reduced, and a region where the electrical device is to be mounted is effectively utilized. The light-receiving device 14 is positioned on the die-capacitor 9 such that the light-sensing region of the light-receiving device 14 locates in a center of the stem 2. Thus, light emitted from the optical fiber disposed over the module effectively enters the light-sensing region of the light-receiving device 14 through the lens provided in the cover.

The light-receiving device 14 is electrically connected to the lead terminal 4 though a bonding wire 15, which enables the light-receiving device 14 to be biased.

Further, the light-receiving device 14 is wire-bonded to the upper electrode of the die-capacitor 9 via a bonding wire 16, which forms a filter circuit, a low-passing filter, with a resistor integrated in the light-receiving device 14 and the die-capacitor 9. Accordingly, the light-receiving device 14 may be operated in stable. The bonding wire 16 is stretched from the light-receiving device 14 to the upper electrode 10 so as to cross over the slit 13.

On the both sides of the die-capacitor 9, additional die-capacitors 17 and 18 are disposed. The die-capacitor 17 has an upper electrode 19, a lower electrode 20 and a dielectric material 21 therebetween. Another die-capacitor also has an upper electrode 22, a lower electrode 23 and a dielectric material 24 therebetween. The lower electrodes 20 and 23 of respective die-capacitor 17 and 18 face the stem and are electrically connected thereto.

Adjacent to the die-capacitor 9 on the stem 2, a pre-amplifier 25 is disposed. The pre-amplifier 25 amplifies the signal output from the light-receiving device 14. The pre-amplifier 25 is electrically connected to the lead terminal 5 via a bonding wires 26 and 27, and the upper electrode 19 of the die-capacitor 17, which enables that the pre-amplifier 25 is biased from the lead terminal 5. The die-capacitor 17 operates as a coupling capacitor for the voltage source of the pre-amplifier 25. The pre-amplifier 25 is connected to the stem 2 via a bonding wire 28.

Further, the pre-amplifier 25 couples to the light-receiving device 14 via a bonding wire 29, which enables the output of the light-receiving device 14 to be input to the pre-amplifier 25. The lead terminals 6 and 7 are connected to the pre-amplifier 25 via bonding wires 30 and 31. The respective outputs from the lead terminals 6 and 7 are complementary to each other, namely, an phase of output signal from the lead terminal 6 is shifted by 180 as compared to the output signal from the lead terminal 7.

The pre-amplifier 25 is also connected to the upper electrode 22 of the die-capacitor 18 via the bonding wire 32. The die-capacitor 18 operates as a supplementary capacitor of the filtering circuit integrated within the pre-amplifier 25. Although bonding wires shown in the drawings have a string shape, a ribbon-shape wire may be applicable for connecting devices and lead terminals.

Next, an assembling method of the light-receiving module 1 will be described.

First, the stem 2 and die-capacitors 9, 17 and 18, the light-receiving device 14 and the pre-amplifier 25 are prepared. The upper electrode 10 of the die-capacitor 9 has the slit 13 as previously described. The slit 13 may be formed in advance or in simultaneous with the assembly of the light-receiving module 1. The die-capacitors 9, 17 and 18, and preamplifier 25 are mounted on and fixed to the stem 2.

Figure 3A:
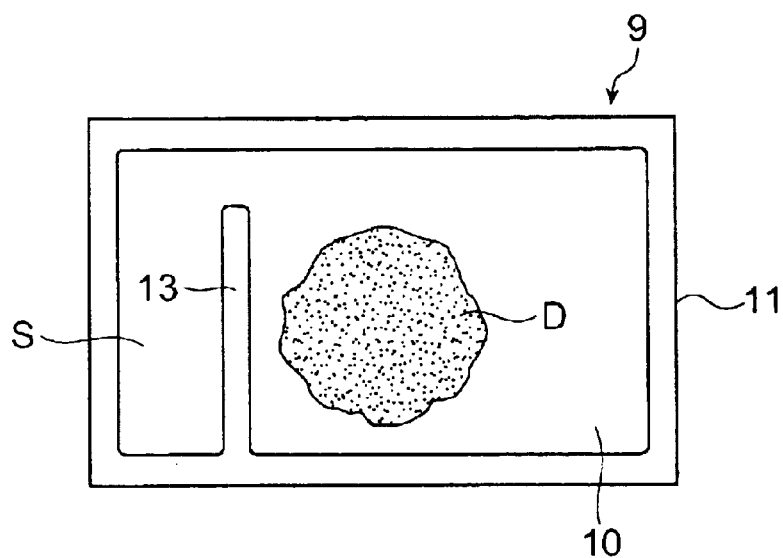
Figure 3B:
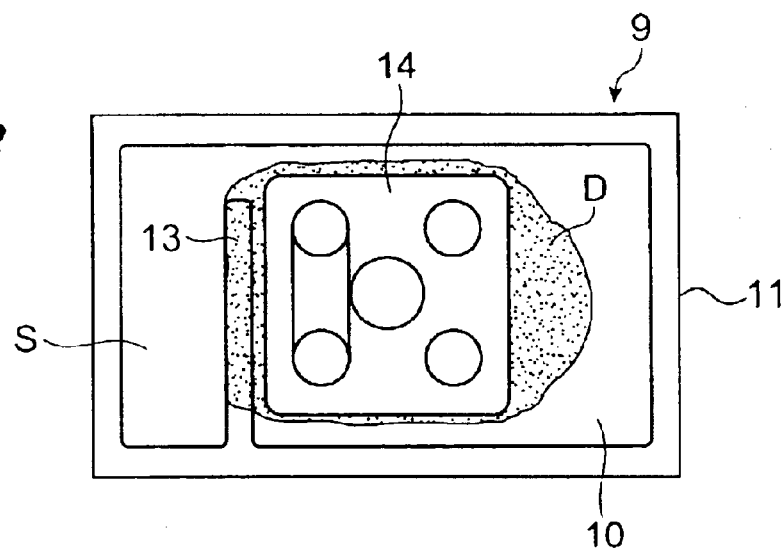

Next, an adhesive D for the die bonding is spread on a center portion of the upper electrode 10 of the die-capacitor 9, as shown in FIG. 3A. The light-receiving device 14 is put on the adhesive D and is fixed to the upper electrode 10 as shown in FIG. 3B.

When the light-receiving device 14 is put on the adhesive D, the adhesive may spread to all directions. Since the slit is provided on the side of the bonding area S on the upper electrode 10, where the wire bonding is to be performed to the light-receiving device 14, as shown in FIG. 3B, the adhesive may be interrupted to spread beyond the slit 13 and can not arrive to the bonding area S.

Figure 3C:
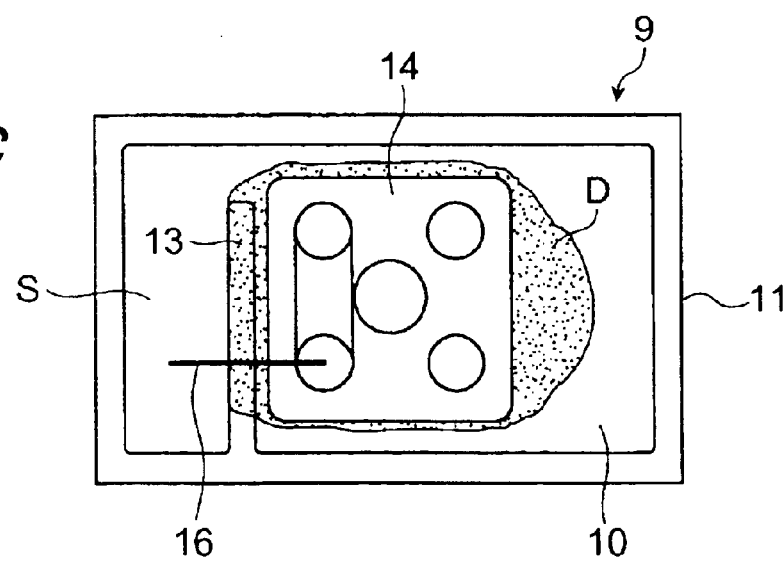

Subsequently to the die mounting of the light-receiving device 14, the upper electrode 10 of the die-capacitor 9 and the electrode on the light-receiving device 14 are wire-bonded to each other as shown in FIG. 3C. Since the bonding area S is free from the adhesive D, the bonding-wire 16 may be reliably contacted to the upper electrode 10. Other die-bonding, such as between the light-receiving device 14 and the pre-amplifier 25, between the pre-amplifier 25 and the lead terminals 5 to 7, and between the stem 2 and die-capacitors 18, are performed.

The present invention does not restricted to preferred embodiments described. One alternation, for example, the upper electrode 10 of the die-capacitor may have a groove for interrupting the adhesive to spread in stead of the slit 13. Although the embodiments have plural die-capacitors for mounting the light-receiving element, for coupling the bias supply and for supplementing the filtering circuit, the die-capacitor may be formed in single body and the upper electrode thereof is divided into three portions, each for the mounting, for the coupling and for the supplementing. Further, the adhesive is used for fixing the light-receiving device to the upper electrode 10 of the die-capacitor 9 in the preferred embodiments described, the fixing material is not restricted to such adhesive. A conductive resin may also be applicable for the fixing material.

What is claimed is:

1. A light receiving module for receiving an optical signal and outputting an electrical signal corresponding to said optical signal, said light receiving module comprising:

a stem made of metal;

a first die capacitor mounted on said stem, said die capacitor having upper and lower electrodes, said upper electrode including a mounting area and a bonding area;

a light receiving device mounted on said mounting area of said first die capacitor with a fixing material, said light receiving device receiving said optical signal and outputting an electrical signal corresponding to said optical sign and electrically connected to said bonding area; and a bonding wire for electrically connecting said light receiving device to said upper electrode of said first die capacitor;

wherein said first die capacitor has a structure for interrupting aid fixing material from spreading from said mounting area to said bonding area.

2. The light-receiving module according to claim 1, wherein said structure for interrupting said fixing material is a slit formed in said upper electrode of said die-capacitor, said slit extending from one side of said upper electrode to opposite side so as to divide said mounting area from said bonding area, said bonding-wire extending so as to cross over said slit.

3. The light-receiving module according to claim 1, wherein said structure for interrupting said fixing material is a groove formed in said upper electrode of said die-capacitor, said groove extending from one side of said upper electrode to opposite side so as to divide said mounting area from said bonding area, said bonding-wire extending so as to cross over said groove.

4. The light-receiving module according to claim 1, wherein said fixing material is an adhesive.

5. The light-receiving module according to claim 1, wherein said fixing material is a conductive resin.

6. The light-receiving module according to claim 1, further comprises a pre-amplifier for amplifying said electrical signal, said pre-amplifier being mounted on said stem and electrically connected to said light-receiving device with a bonding-wire.

7. The light-receiving module according to claim 6, further comprises a second die-capacitor for coupling a bias voltage to said pre-amplifier.

8. The light-receiving module according to claim 7, wherein said first die-capacitor and said second die-capacitor has unity body.

9. The light-receiving module according to claim 6, wherein said pre-amplifier includes a filtering circuit constituted by a capacitance and a resistance, and said light-receiving module further comprises a third die-capacitor for supplementing said capacitance of said filtering circuit.

10. The light-receiving module according to claim 9, wherein said first die-capacitor and said third die-capacitor has unity body.

* * * * *